US008872428B2

(12) United States Patent
Kudela et al.

(10) Patent No.: US 8,872,428 B2
(45) Date of Patent: Oct. 28, 2014

(54) PLASMA SOURCE WITH VERTICAL GRADIENT

(75) Inventors: Jozef Kudela, San Jose, CA (US); Tsutomu Tanaka, Santa Clara, CA (US); Suhail Anwar, San Jose, CA (US); Carl A. Sorensen, Morgan Hill, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/405,297

(22) Filed: Feb. 25, 2012

(65) Prior Publication Data

US 2012/0217874 A1 Aug. 30, 2012

Related U.S. Application Data

(60) Provisional application No. 61/447,003, filed on Feb. 25, 2011.

(51) Int. Cl.
| H05H 1/24 | (2006.01) |
| H05H 1/46 | (2006.01) |
| C23C 14/02 | (2006.01) |
| C23C 14/34 | (2006.01) |
| C23C 14/58 | (2006.01) |

(52) U.S. Cl.
CPC ............... H05H 1/46 (2013.01); C23C 14/028 (2013.01); C23C 14/34 (2013.01); C23C 14/58 (2013.01); H05H 2001/4682 (2013.01)
USPC ............ 315/111.21; 315/111.71; 315/111.31; 315/111.81

(58) Field of Classification Search
USPC .................... 204/157.15, 157.44; 156/345.51, 156/345.38, 345.41; 118/723 R, 723 E, 723 I; 315/111.21, 111.71, 111.31, 111.81
See application file for complete search history.

(56) References Cited

U.S. PATENT DOCUMENTS 5,558,718 A * 9/1996 Leung ........................ 118/723 E
6,156,667 A * 12/2000 Jewett ........................... 438/715
(Continued)

FOREIGN PATENT DOCUMENTS

JP 2003-86581 A 3/2003
JP 4017796 B2 12/2007

OTHER PUBLICATIONS

E. Rauchle, "Duo-plasmaline, a surface wave sustained linearly extended discharge", J. Phys. IV France 8 (1998), pp. Pr7-99-Pr7-108.

(Continued)

Primary Examiner — Vibol Tan
(74) Attorney, Agent, or Firm — Robert J. Stern

(57) ABSTRACT

A plasma source includes upper and lower portions. In a first aspect, an electrical power source supplies greater power to the upper portion than to the lower portion. In a second aspect, the plasma source includes three or more power couplers that are spaced apart vertically, wherein the number of plasma power couplers in the upper portion is greater than the number of plasma power couplers in the lower portion. The upper and lower portions of the plasma source can be defined as respectively above and below a horizontal geometric plane that bisects the vertical height of the plasma source. Alternatively, the upper and lower portions can be defined as respectively above and below a horizontal geometric plane that bisects the combined area of first and second workpiece positions.

19 Claims, 5 Drawing Sheets

(56) References Cited

U.S. PATENT DOCUMENTS

| | | |
|---|---|---|
| 7,381,292 B2 | 6/2008 | Lee et al. |
| 2008/0236491 A1 | 10/2008 | Brcka |
| 2009/0159423 A1* | 6/2009 | Kudela et al. ............ 204/157.44 |
| 2013/0126331 A1* | 5/2013 | Kudela et al. ............ 204/157.15 |
| 2013/0221833 A1 | 8/2013 | Kudela |

OTHER PUBLICATIONS

M. Walker et al., "Silicon oxide films from the Plasmodul", Vacuum 57 (2000), pp. 387-397.

M. Moisan et al., "The Development and Use of Surface-Wave Sustained Discharges for Applications", Advanced Technologies Based on Wave and Beam Generated Plasmas, ed. H. Schluter & A. Shivarova, NATO ASI Partnership Subseries 3, Kluwer Academic Publisher (Netherlands 1999).

H Sugai et al., "High-density flat plasma production based on surface waves", Plasma Sources Sci. Technol. 7 (UK 1998), pp. 192-205.

Anders, "Plasma and Ion Sources in Large Area Coatings: A Review", ICMCTF 2005, Lawrence Berkeley National Laboratory paper No. 57127 (USA 2005).

Kyong Nam Kim et al., "Characteristics of Parallel Internal-Type Inductively Coupled Plasmas for Large Area Flat Panel Display Processing", Japanese Journal of Applied Physics, vol. 43, No. 7A (Japan 2004), pp. 4373-4375.

Yoshiaki Takeuchi, "Characteristics of Very-High-Frequency-Excited SiH4 Plasmas using a Ladder-Shaped Electrode", Japanese Journal of Applied Physics, vol. 40, Part 1, No. 5A, (Japan 2001), pp. 3405-3408.

* cited by examiner

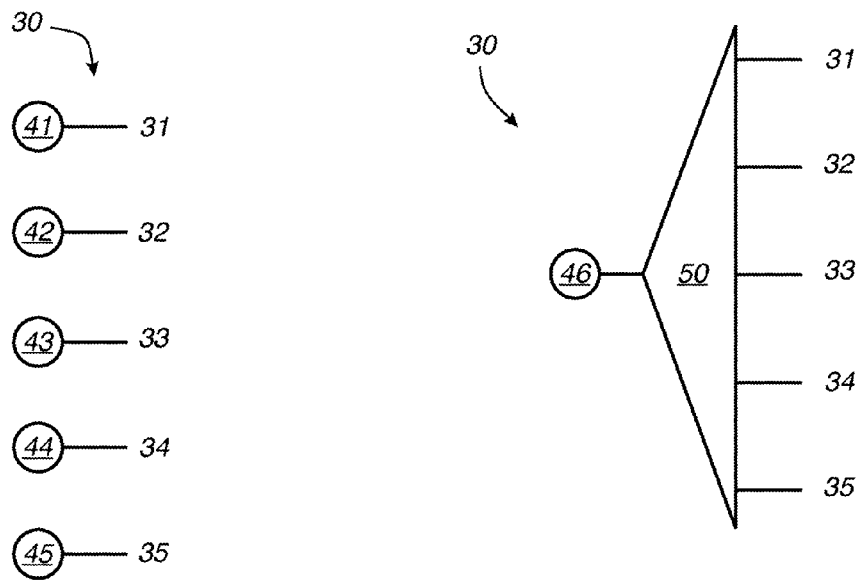
Fig. 3
Fig. 4
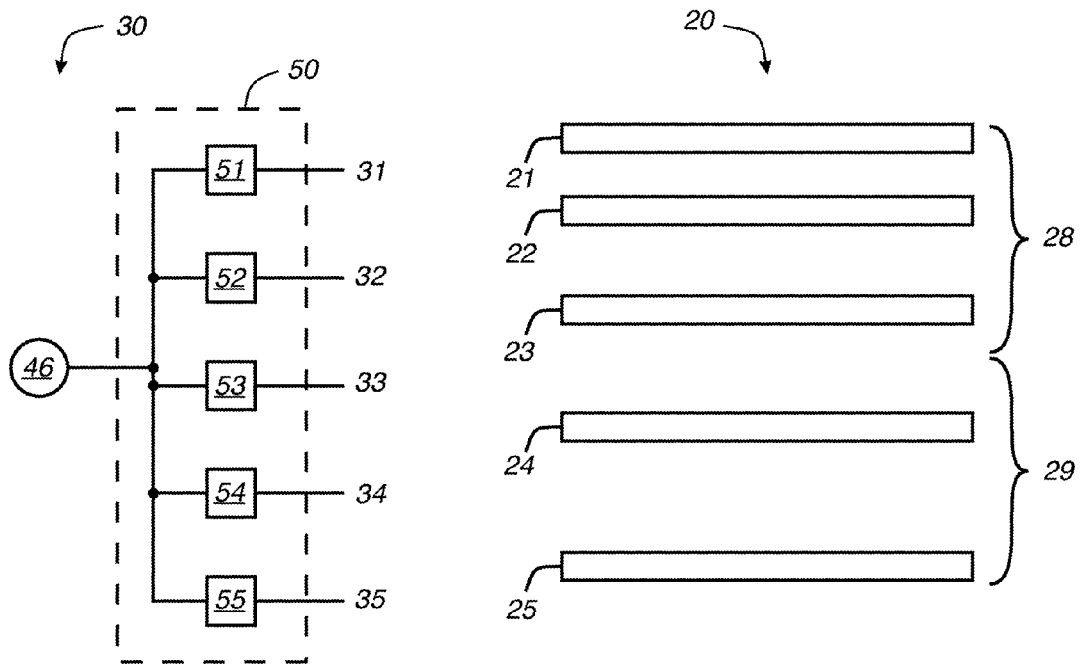
Fig. 5
Fig. 6

PLASMA SOURCE WITH VERTICAL GRADIENT

CROSS REFERENCE TO RELATED APPLICATION

This patent application claims the benefit of U.S. provisional patent application No. 61/447,003 filed Feb. 25, 2011.

TECHNICAL FIELD

The invention relates generally to a plasma source for a plasma chamber for fabricating electronic devices such as semiconductors, displays and solar cells. The invention relates more specifically to methods and apparatus for coupling power from a plasma source to a plasma within the plasma chamber so as to improve spatial uniformity when multiple workpieces are processed simultaneously.

BACKGROUND ART

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece or etching of selected portions of such layers on the workpiece surface.

It is important for a plasma fabrication process to be performed with high spatial uniformity over the surface of the workpiece. That is, a deposition process should be performed so that the deposited material has uniform thickness and quality at all positions on the surface of the workpiece. Likewise, an etch process should etch material at a uniform rate at all such positions. Spatial uniformity of a plasma fabrication process typically requires spatial uniformity of the density of the plasma adjacent the surface of the workpiece.

One approach for increasing the manufacturing throughput of a plasma chamber is to process two or more workpieces within the plasma chamber simultaneously. However, processing multiple workpieces within the plasma chamber increases the difficulty of achieving spatial uniformity of the density of the plasma adjacent the surface of the workpiece.

SUMMARY OF THE INVENTION

Each of the following aspects of the invention includes apparatus and method counterparts.

The invention comprises a plasma source having upper and lower portions.

In a first aspect of the invention, an electrical power source supplies a greater level of power to the upper portion of a plasma source than to the lower portion of the plasma source.

In a second aspect of the invention, which does not require an electrical power source, the plasma source includes three or more power couplers that are spaced apart vertically. The number of plasma power couplers in the upper portion of the plasma source is greater than the number of plasma power couplers in the lower portion of the plasma source.

In either the first or second aspect of the invention, the upper and lower portions of the plasma source can be defined as the portions of the plasma source that are respectively above and below a horizontal geometric plane that bisects the vertical height of the plasma source. We use "bisect the vertical height" to mean that half of the vertical height of the plasma source is above the plane, and half is below the plane.

Optionally, either the first or second aspect of the invention further comprises first and second workpiece supports for supporting first and second workpieces at first and second workpiece positions, respectively. In this case, the upper and lower portions of the plasma source can be defined relative to the workpiece positions rather than relative to the vertical height of the plasma source. Specifically, the upper and lower portions can be defined as the portions of the plasma source that are respectively above and below a horizontal geometric plane that bisects the combined area of the two workpiece positions. We use "bisect the combined area" to mean that half of the combined area of the two workpiece positions is above the plane, and half of such combined area is below the plane. This definition encompasses optional embodiments in which the workpiece positions move horizontally during processing of the workpieces.

Preferably the first and second workpiece positions are tilted at a first and second acute angle, respectively, relative to a vertical plane between the two workpiece positions such that the first and second workpiece positions are more widely spaced at their respective upper ends than at their respective lower ends.

Advantageously, each of the foregoing aspects or embodiments of the invention tends to increase the density of the plasma adjacent the upper portion of the plasma source. When used in combination with tilted workpieces whose upper ends are more widely spaced than their lower ends, the invention advantageously offsets the decrease in the density of the plasma adjacent the upper portion of the workpieces that otherwise would result from the two workpieces being more widely spaced at their upper ends than at their lower ends. Consequently, the invention enables a more uniform spatial distribution of the density of the plasma adjacent the exposed surfaces of the respective workpieces.

Each of the aspects or embodiments of the invention preferably further includes a plasma chamber, wherein the plasma source couples power to a plasma within the plasma chamber. Preferably the plasma source is the only source of power to the plasma within the plasma chamber. Consequently, the plasma source of the invention determines the spatial distribution of the plasma, thereby promoting the advantages described in the preceding paragraph.

Optionally, the power supplied by the electrical power source can be time-varying, in which case the term "level of power" means "time-averaged level of power". In other words, the power differential required by the invention is fulfilled if the electrical power source supplies a greater time-averaged level of power to the upper portion of the plasma source than to the lower portion of the plasma source.

Each geometric plane referred to in this patent specification is merely a mathematical frame of reference. It is not a tangible object, and it is not an element or component of the invention.

BRIEF DESCRIPTION OF THE DRAWINGS

FIG. 3 is an electrical schematic diagram of an electrical power source having multiple electrical power generators.

FIG. 4 is an electrical schematic diagram of an electrical power source having a power splitter.

FIG. 5 is an electrical schematic diagram of a power splitter having reactances.

FIG. 6 is a sectional side view of a plasma source similar to that of FIG. 2, but with unevenly spaced plasma power couplers.

BEST MODE FOR CARRYING OUT THE INVENTION

1. Overview of Invention

Figure 1:
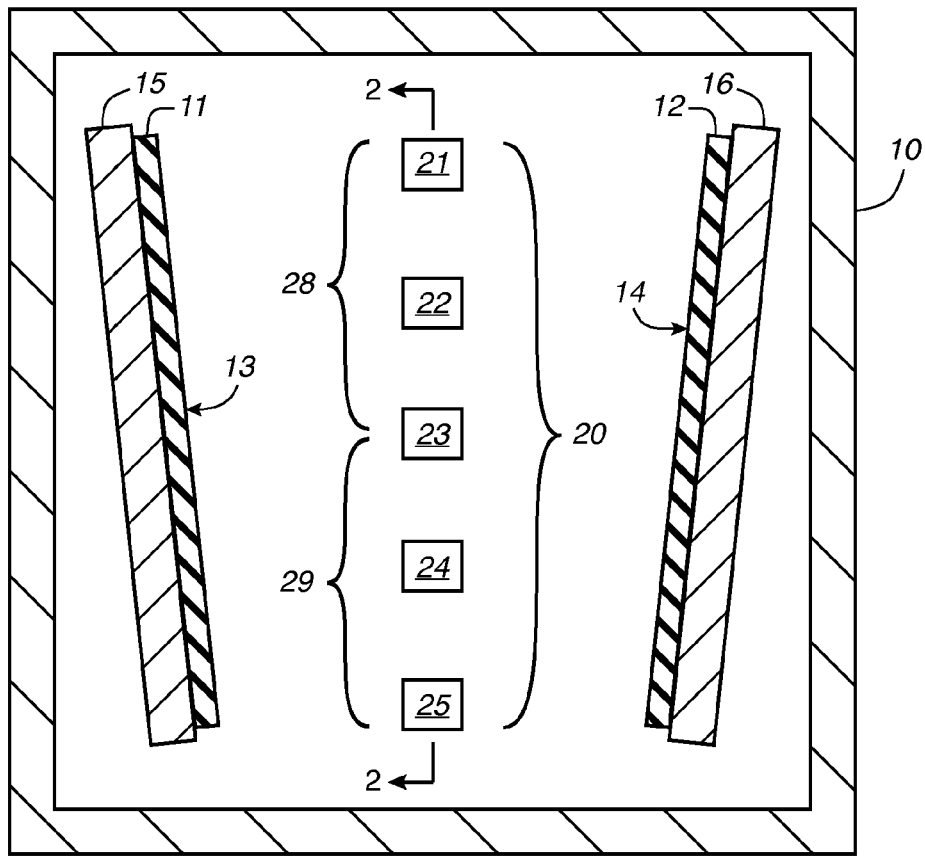
FIG. 1 is a partially schematic, sectional side view of a plasma chamber having a plasma source between two workpieces tilted in opposite directions. The view is from a section plane perpendicular to the plasma source.

FIG. 1 shows a plasma chamber having an interior enclosed by chamber wall 10. Within the interior of the plasma chamber are first and second workpiece supports 15, 16 that support first and second workpieces at respective positions within the plasma chamber referred to as the first and second workpiece positions 11, 12. A plasma source 20 is between the two workpieces. Each workpiece has a respective exposed surface 13, 14 that faces the plasma source.

Additional components of the plasma chamber that are conventional are omitted from FIG. 1. Except for the novel features described below, the plasma chamber can be of any conventional design commonly used to perform processes for fabricating electronic devices such as semiconductors, displays and solar cells. Such plasma fabrication processes include chemical vapor deposition of semiconductor, conductor or dielectric layers on the exposed surfaces 13, 14 of the workpieces or etching of selected portions of such layers on the exposed surfaces 13, 14 of the workpieces.

In performing a plasma process on the exposed surfaces 13, 14 of the workpieces, one or more process gases are dispensed into the plasma chamber through one or more conventional gas inlets (not shown). The plasma source 20 is connected to receive electrical power from a conventional electrical power source 30 and couples the electrical power to the process gases to form a plasma within the plasma chamber.

The workpiece supports 15, 16 position the workpieces almost vertically in order to facilitate simultaneously exposing the exposed surfaces 13, 14 of both workpieces to plasma excited by the plasma source 20 between the two workpieces. However, each workpiece position 11, 12 is tilted at an acute angle relative to a vertical plane so that each workpiece support can support the weight of its respective workpiece along all, or a substantial portion, of its entire height. Consequently, the two workpiece positions 11, 12 are more widely spaced from each other and from the plasma source 20 at their upper ends than at their lower ends.

Because the workpiece positions 11, 12 are tilted, if the plasma source 20 were vertically uniform, the density of the plasma adjacent the exposed surfaces 13, 14 of the first and second workpieces would tend to be largest near the lower end and smallest near the upper end of each workpiece because the lower end is closer to the plasma source. In other words, a conventional vertically uniform plasma source would produce a plasma density adjacent the exposed surfaces 13, 14 of the workpieces that would have a vertical gradient, which is an undesirable spatial non-uniformity.

Advantageously, the invention enables this undesirable vertical gradient to be reduced or eliminated. The electrical power source 30 supplies a greater level of electrical power to the upper portion 28 of the plasma source 20 than to the lower portion 29 of the plasma source. Consequently, the density of the plasma is increased adjacent the upper portion of the plasma source, thereby offsetting the decrease in the density of the plasma adjacent the upper portion of the workpiece positions 11, 12 that otherwise would result from the tilt of the workpiece positions. Therefore, the invention enables a more uniform spatial distribution of the density of the plasma adjacent the respective exposed surfaces 13, 14 of the workpieces.

Optionally, the power supplied by the electrical power source 30 can be time-varying, in which case the term "level of power" means "time-averaged level of power". In other words, the power differential required by the invention is fulfilled if the electrical power source supplies a greater time-averaged level of power to the upper portion 28 of the plasma source 20 than to the lower portion 29 of the plasma source.

The respective levels of power supplied to the upper and lower portions of the plasma source preferably are established so as to improve the uniformity of the plasma density adjacent the exposed surfaces 13, 14 of the workpieces 11, 12 relative to the non-uniformity of such plasma density that would be produced if the first and second levels of power were equal, or else so as to improve the uniformity of a process performed on the workpieces. The optimum levels of power can be determined empirically.

In defining the invention, the upper portion 28 and lower portion 29 of the plasma source 20 are defined as the portions of the plasma source that are respectively above and below a horizontal geometric plane. In a first aspect or first embodiment of the invention, the horizontal geometric plane bisects the vertical height of the plasma source. We use "bisect the vertical height" to mean that half of the vertical height of the plasma source is above the plane, and half is below the plane. In a second aspect or second embodiment of the invention, the horizontal geometric plane bisects the combined area of the two workpiece positions 11, 12. We use "bisect the combined area" to mean that half of the combined area of the two workpiece positions is above the plane, and half of such combined area is below the plane.

The plasma source 20 includes one or more plasma power couplers 21-27. We define a "plasma power coupler" as an electronic component capable of receiving electrical power from an electrical power source 30 and coupling such power to the plasma within the plasma chamber. Examples of a plasma power coupler include: (i) a conventional electrode for capacitively coupling electrical power to the plasma; (ii) a conventional antenna for inductively coupling electrical power to the plasma; and (iii) a conventional guided wave applicator or other microwave applicator.

Optionally, the workpiece supports 15, 16 may move the workpieces during processing of the workpieces in order to further improve the spatial uniformity of the plasma processes performed on the exposed surfaces of the workpieces.

In order to expose the two workpieces to equal levels of plasma density, the plasma power coupler 26 preferably is positioned within a vertical geometric plane that is equidistant between the two workpiece positions 11, 12. In order to provide uniform plasma processing across the entire exposed surface of each workpiece, the plasma power coupler preferably occupies an area within such geometric plane that is approximately equal to the area of each of the exposed surfaces 13, 14 of the workpieces.

Throughout this patent specification, when we refer to a physical dimension of the plasma source 20, such as its vertical height or its area, such dimension should be interpreted to include only the portions of the plasma source that receive electrical power from the electrical power source 30 and are capable of coupling electrical power to a plasma within the plasma chamber. Such dimension should not be interpreted to include ancillary portions of the plasma source such as mechanical mounting flanges or electrical transmission lines that receive power from the electrical power source 30 but are not capable of coupling power to the plasma within the plasma chamber.

2. Vertically Spaced Plasma Power Couplers

Figure 2:
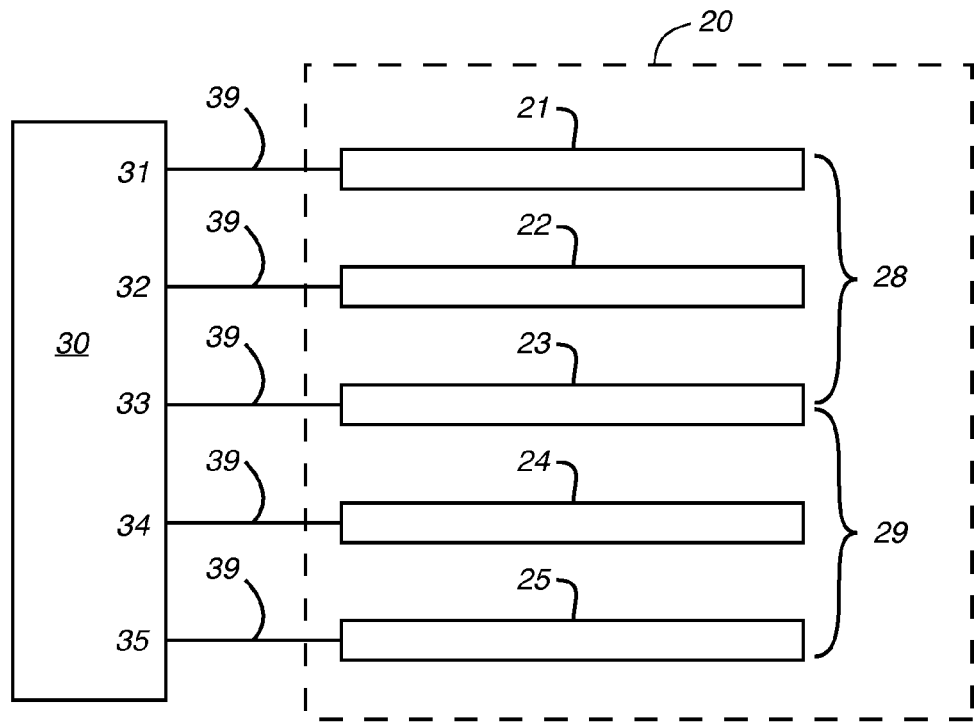
FIG. 2 is a sectional side view of the plasma source of FIG. 1. The view is from a section plane parallel to the plasma source.

FIGS. 1 and 2 illustrate one embodiment of the plasma source 20 that includes five plasma power couplers 21-25. In the plasma source of FIGS. 1 and 2, each plasma power coupler is oriented horizontally, and the five plasma power couplers are spaced apart vertically within a geometric plane that is equidistant between the two workpieces 11, 12.

The invention is not limited to any specific number, orientation or arrangement of the plasma power couplers 21-27. For example, alternative embodiments with only one vertically oriented plasma power coupler 26 (FIG. 8) or a horizontally-spaced array of ten vertically oriented plasma power couplers 27 (FIGS. 9 and 10) will be described subsequently.

FIG. 2 illustrates that the five plasma power couplers 21-25 can be connected via respective electrical transmission lines 39 to receive electrical power from five respective outputs 31, 32, 33, 34, 35 of an electrical power source 30.

In accordance with the first and second aspects or embodiments of the invention as defined above, the electrical power source 30 supplies a greater level of power to the upper portion 28 of the plasma source 20 than to the lower portion 29 of the plasma source. In the embodiment of FIGS. 1 and 2, this means that the sum of the respective levels of power supplied by the first two outputs 31, 32 of the electrical power source to the two plasma power couplers 21, 22 above the center of the plasma source is greater than the sum of the respective levels of power supplied by the last two outputs 34, 35 of the electrical power source to the two plasma power couplers 24, 25 below the center of the plasma source. In other words, if the five outputs 31-35 of the electrical power source supply respective levels of power $P_1$-$P_5$ to the respective plasma power couplers 31-35, then $P_1+P_2>P_4+P_5$.

In the embodiment illustrated in FIGS. 1 and 2, the plasma source 20 is centered vertically and horizontally relative to the two workpiece positions 11, 12. Consequently, the horizontal geometric plane that bisects the combined area of the two workpiece positions is coincident with the horizontal geometric plane that bisects the vertical height of the plasma source 20, and such plane also bisects the middle plasma power coupler 23. Therefore, the electrical power supplied by output 33 of the electrical power source 30 to the middle plasma power coupler 23 is considered to be divided equally between the upper and lower portions 28, 29 of the plasma source. Therefore, the level of power supplied to the middle plasma power coupler 23 does not affect the difference between the respective levels of power supplied to the upper and lower portions of the plasma source.

Although FIG. 2 shows the respective outputs 31-35 of the electrical power source being connected to only one end of each respective plasma power coupler 21-25, the electrical power source optionally can be connected to supply power to both ends of each plasma power coupler 21-25. Examples are described below in the section entitled "5. Vertically Extending Plasma Power Coupler".

Alternatively, each output 31-35 of the electrical power source 30 can have two electrical connections, one electrically grounded and one ungrounded, between which the electrical power source supplies electrical power. The electrically grounded and ungrounded connections can be connected to opposite ends of a plasma power coupler, either directly or through a reactance. In other words, one end a plasma power coupler can be connected to an ungrounded connection of an output of the electrical power source, and the opposite end of that plasma power coupler can be connected to electrical ground, either directly or through a reactance.

3. Power Source

FIG. 3 illustrates that the electrical power source 30 can include a separate electrical power generator 41-45 for each output 31-35. Alternatively, FIG. 4 illustrates that the electrical power source 30 can include a single electrical power generator 46 in combination with a power splitter 50 that supplies a portion of the total power output of the electrical power generator 46 to each of the five outputs 31-35.

In the FIG. 4 embodiment, the power splitter 50 can be any conventional design. For example, the power splitter can include one or more RF transformers (not shown), each of which has an input connected to the electrical power generator 46 and one or more output taps connected to one or more outputs 31-35 of the power source 30.

FIG. 5 illustrates an alternative embodiment of the power splitter 50 shown in FIG. 4. In the FIG. 5 embodiment, the power splitter 50 includes five reactances 51-55 respectively connected between the electrical power generator 46 and the respective outputs 31-35 of the electrical power source. Examples of suitable reactances are capacitors, inductors or transmission lines. The reactances can have different values so as to apportion different levels of electrical power or voltage to the different outputs 31-35. Some of the reactances can be omitted and replaced with a direct electrical connection between the electrical power generator and one or more of the outputs 31-35.

For example, suppose that one of the reactances is a capacitor connected in series between the electrical power generator and one of the outputs of the electrical power source. Also suppose that the plasma power coupler connected to that output has an inductive input impedance. A capacitive reactance and an inductive reactance connected in series are subtractive. Therefore, if the capacitor has a capacitive reactance whose magnitude is less than the inductive reactance of the aforesaid input impedance, then the capacitor will reduce the total impedance between the electrical power generator and the plasma power coupler, thereby increasing the level of electrical power supplied to that plasma power coupler. Conversely, if the capacitor has a capacitive reactance whose magnitude is more than two times the inductive reactance of the aforesaid input impedance, then the capacitor will increase the total impedance between the electrical power generator and the plasma power coupler, thereby decreasing the level of electrical power supplied to that plasma power coupler.

Optionally, as stated in the "Summary of the Invention", the level of power supplied by each output 31-35 of the electrical power source 30 can be time-varying, in which case the level of power referred to in the definition of the invention is the time-averaged level of power. In other words, the electrical power source supplies a greater time-averaged level of power to the upper portion 28 of the plasma source than to the lower portion 29 of the plasma source.

For example, the electrical power source 30 can control the duty cycle of the power supplied by each of its outputs 31-35 so that the power supplied by the first two outputs 31, 32 to the upper portion 28 of the plasma source has a longer duty cycle than the power supplied by the last two outputs 34, 35 to the lower portion 29, thereby supplying a greater time-averaged power to the upper portion. To implement such duty cycles, the power splitter 50 can be a conventional time-division multiplexor.

4. Unequal Distribution or Spacing of Plasma Power Couplers

FIG. 6 illustrates additional embodiments of the invention in which the plasma source 20 comprises three or more plasma power couplers that are spaced apart vertically. The number of plasma power couplers 21-23 in the upper portion 28 of the plasma source is greater than the number of plasma power couplers 24-25 in the lower portion 29 of the plasma source. Consequently, the average spacing between the plasma power couplers 21-23 in the upper portion 28 of the plasma source is smaller than the average spacing between the plasma power couplers 24-25 in the lower portion 29 of the plasma source.

In defining the invention, the upper portion 28 and lower portion 29 of the plasma source 20 are defined as the portions of the plasma source that are respectively above and below a horizontal geometric plane. More specifically, in a third aspect or embodiment of the invention, the upper portion 28 and lower portion 29 of the plasma source 20 are defined as the portions of the plasma source that are respectively above and below a horizontal geometric plane that bisects the vertical height of the plasma source. As in the previously described first aspect or first embodiment of the invention, we use "bisect the vertical height" to mean that half of the vertical height of the plasma source is above the plane, and half is below the plane.

Alternatively, in a fourth aspect or embodiment of the invention, the upper portion 28 and lower portion 29 of the plasma source 20 are defined relative to the two workpiece positions 11, 12. Specifically, the upper and lower portions of the plasma source are defined as the portions of the plasma source that are respectively above and below a horizontal geometric plane that bisects the combined area of the two workpiece positions. As in the previously described second aspect or second embodiment of the invention, we use "bisect the combined area" to mean that half of the combined area of the two workpiece positions is above the plane, and half of such combined area is below the plane.

In both of these embodiments of the invention, the electrical power source optionally can supply the same level of power to each of the plasma power couplers 21-25. In that case, because the number of plasma power couplers 21-23 in the upper portion 28 of the plasma source 20 is greater than the number 24-25 in the lower portion 29, the electrical power source 30 will supply a greater level of power to the plasma power couplers in the upper portion of the plasma source than to those in the lower portion.

Because the desired power differential is achieved even if each plasma power coupler 21-25 receives the same level of power, all of the plasma power couplers can be connected to the same output 31 of the electrical power source 30. In other words, there is no need for the electrical power source to include more than one electrical output 31.

Alternatively, the electrical power source 30 can include a separate electrical power generator 41-45 for each plasma power coupler 21-25, but there is no need for the generators to supply different levels of power. In other words, each electrical power generator can supply the same level of power to the respective plasma power coupler to which it is connected.

5. Vertically Extending Plasma Power Coupler

In the embodiments described above, the upper portion and the lower portion of the plasma source include different plasma power couplers 21-25. Alternative embodiments now will be described to illustrate that the upper portion 28 and lower portion 29 of the plasma source 20 can be the upper and lower portions of a single plasma power coupler 26 or 27. In each of the following embodiments, the electrical power source 30 supplies a greater level of electrical power to the upper portion of each plasma power coupler than to the lower portion of the plasma power coupler.

Figure 7:
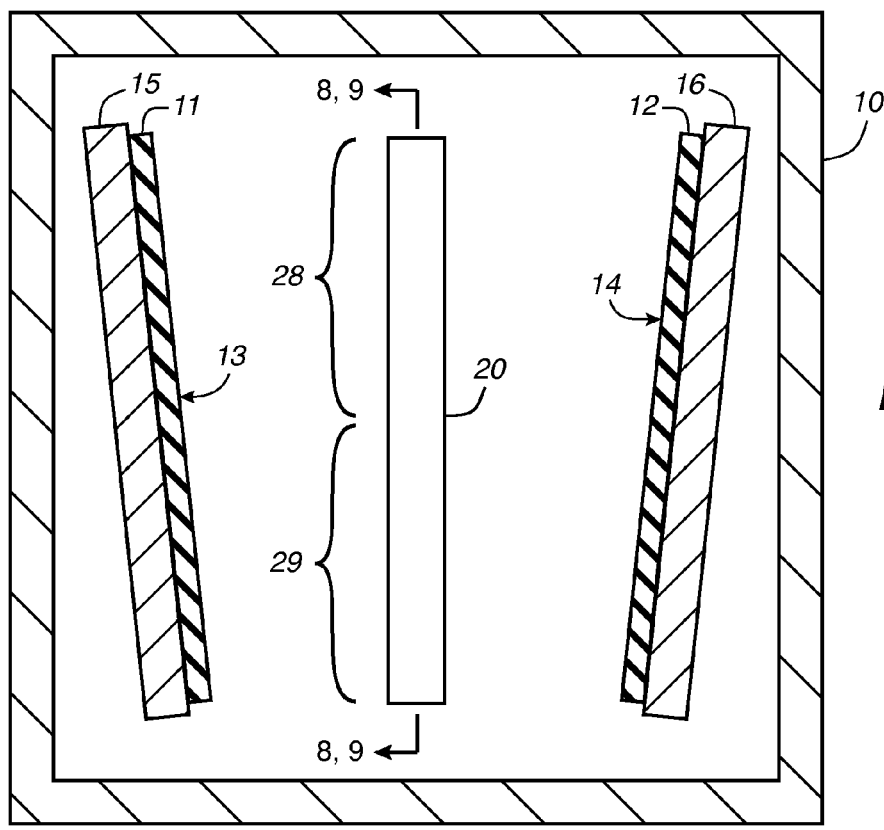
FIG. 7 is a view similar to FIG. 1 of a plasma chamber including an alternative plasma source having one or more vertically extending plasma power couplers.

FIG. 7 is a view similar to FIG. 1 of a plasma chamber including a plasma source 20 having one or more vertically extending plasma power couplers 26, 27.

Figure 8:
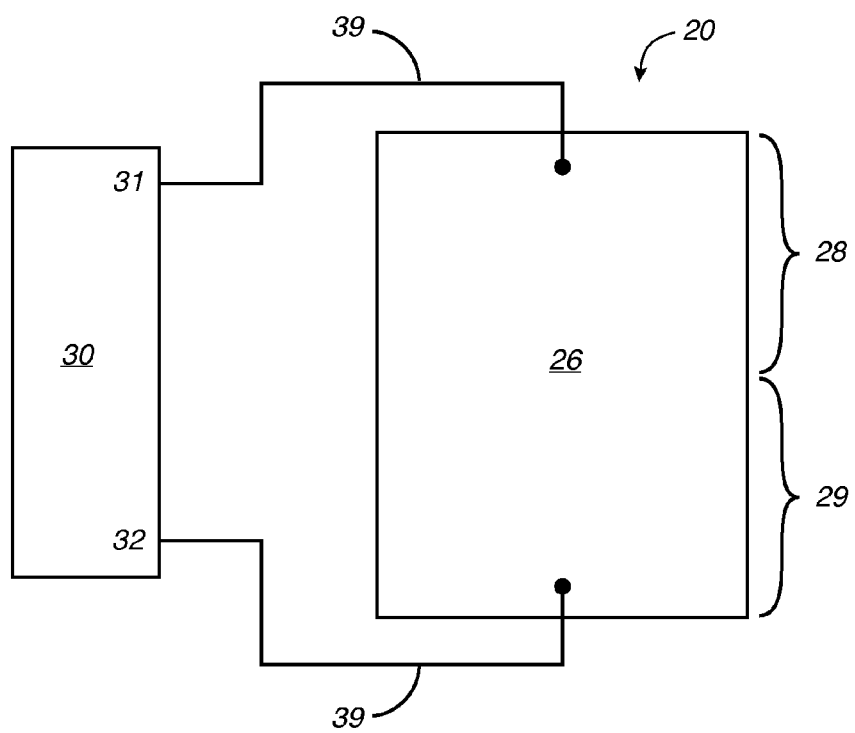
FIG. 8 is a partially schematic, sectional side view of an embodiment of the plasma source of FIG. 7 having only one plasma power coupler.

FIG. 8 illustrates an embodiment of the plasma source 20 having only a single plasma power coupler 26. The electrical power source 30 includes first and second outputs 31, 32. The first output 31 is connected to supply a first level of electrical power to the upper portion 28 of the plasma power coupler 26. The second output 32 is connected to supply a second level of electrical power to the lower portion 29 of the plasma power coupler. The first level of power is greater than the second level of power.

Figure 9:
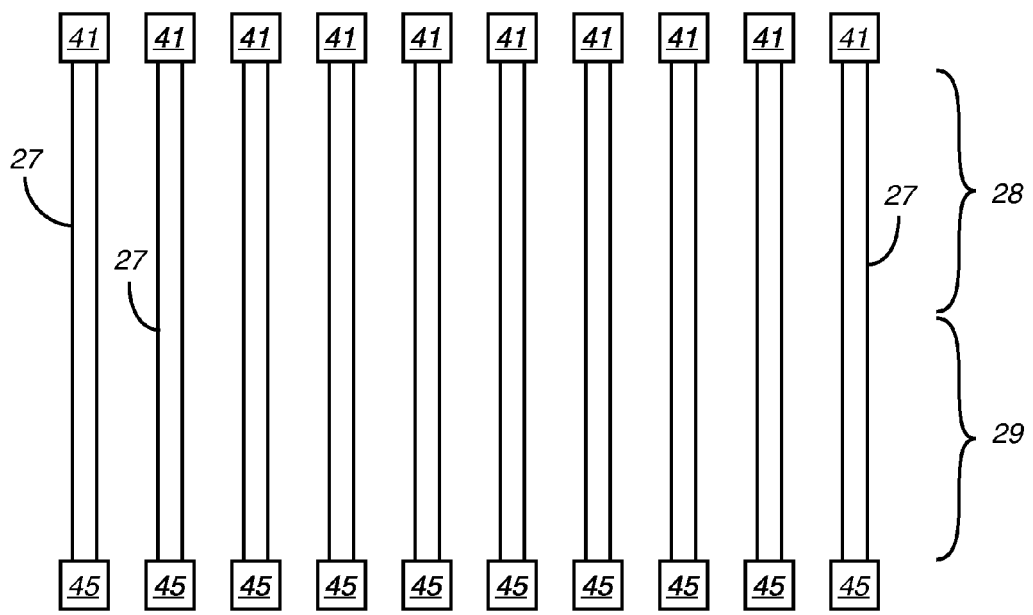
FIG. 9 is a partially schematic, sectional side view of an embodiment of the plasma source of FIG. 7 having an array of vertically oriented plasma power couplers.

FIG. 9 illustrates an alternative embodiment of the plasma source 20 that includes ten plasma power couplers 27. In the plasma source of FIG. 9, each plasma power coupler is oriented vertically, and the ten plasma power couplers are spaced apart horizontally within a vertical geometric plane that is equidistant between the two workpieces 11, 12.

FIG. 9 illustrates that the electrical power generators 41, 45 optionally can be connected directly to the plasma power couplers 27 without any intermediate transmission lines 39. In the FIG. 9 embodiment, the electrical power source 30 comprises a first set of ten electrical power generators 41 and a second set of electrical power generators 45. Each electrical power generator 41 in the first set is connected to the upper end of a respective one of the ten plasma power couplers 27, thereby supplying electrical power to the upper portion 28 of the plasma source 20. Each electrical power generator 45 in the second set is connected to the lower end of a respective one of the ten plasma power couplers 27, thereby supplying electrical power to the lower portion 29 of the plasma source.

In the first and second aspects or embodiments of our invention as defined in the Summary of the Invention, the level of electrical power supplied to the upper portion 28 of the plasma source 20, which is the sum of the electrical power supplied by all of the electrical power generators 41 in the first set, is greater than the level of electrical power supplied to the lower portion 29 of the plasma source 20, which is the sum of the electrical power supplied by all of the electrical power generators 45 in the second set.

Figure 10:
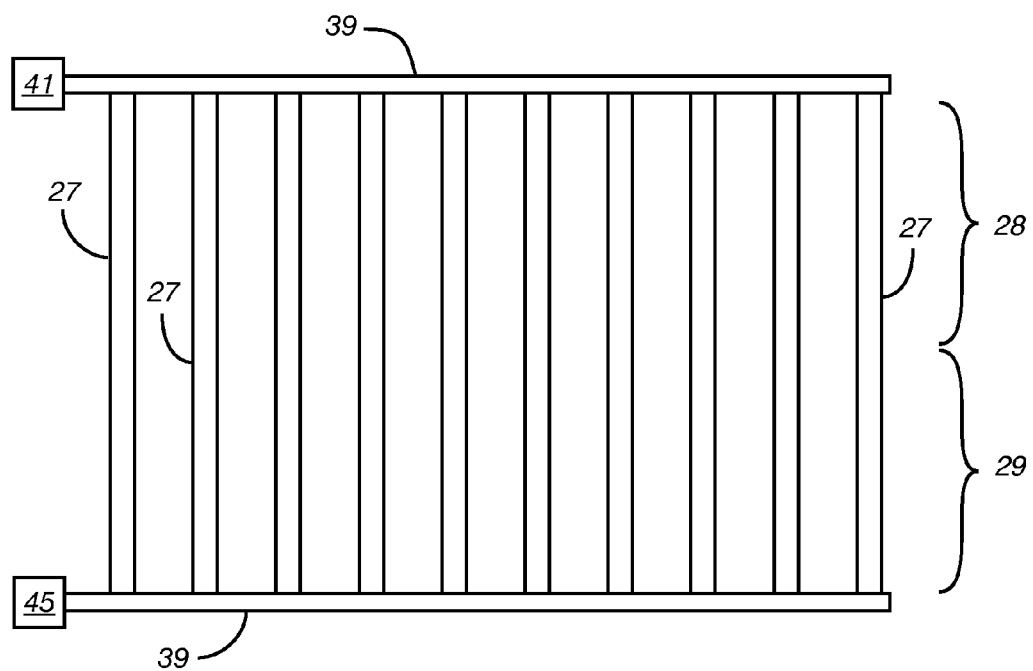
FIG. 10 is a view similar to FIG. 9 of the array of vertically oriented plasma power couplers connected to only two electrical power generators.

FIG. 10 illustrates an embodiment similar to that of FIG. 9, except that a single electrical power generator 41 is connected (via a transmission line 39) to supply power to the upper portion 28 of each of the ten plasma power couplers 27, and a single electrical power generator 45 is connected (via a transmission line 39) to supply power to the lower portion 29 of each of the ten plasma power couplers. The level of power supplied by the first electrical power generator 41 is greater than the level of power supplied by the second electrical power generator 45.

Optionally, as stated in the "Summary of the Invention", the level of power supplied by each electrical power generator 41, 45 can be time-varying, in which case each level of power referred to in the definition of the invention is the time-averaged level of power. In other words, in the embodiment of FIG. 8, the time-averaged level of power supplied by the first output 31 of the power supply is greater than the time-averaged level of power supplied by the second output 32. Likewise, in the embodiments of FIGS. 9 and 10, the time-averaged value of the sum of the electrical power supplied by all of the electrical power generators 41 in the first set is greater than the time-averaged value of the sum of the electrical power supplied by all of the electrical power generators 45 in the second set.

Figure 11:
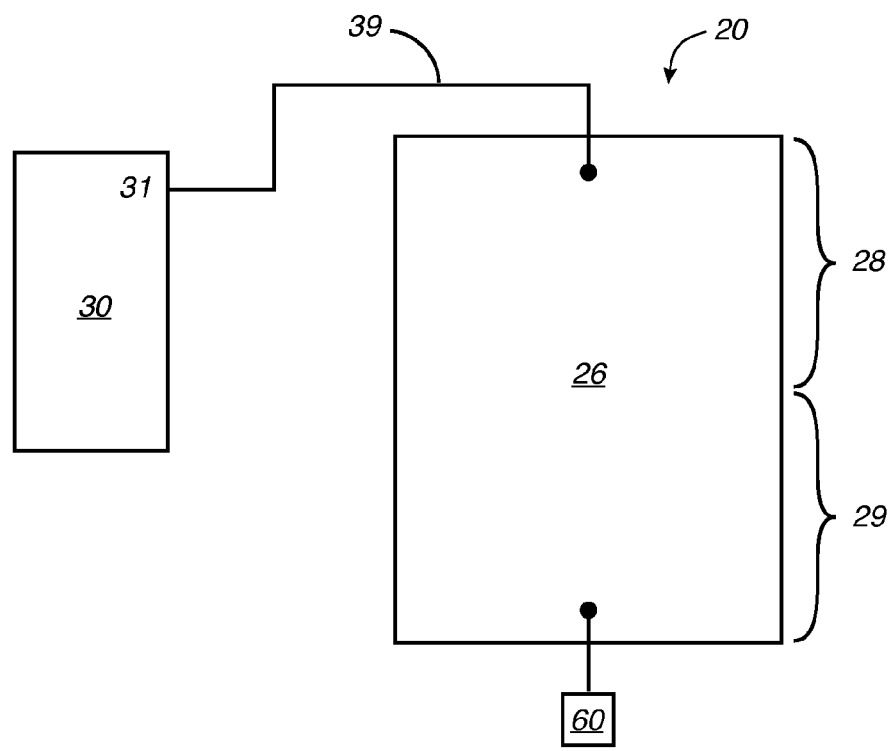
FIGS. 11 and 12 are similar to FIGS. 8 and 9, respectively, except that the lower portion of each plasma power coupler is connected to an electrical reactance.
Figure 12:
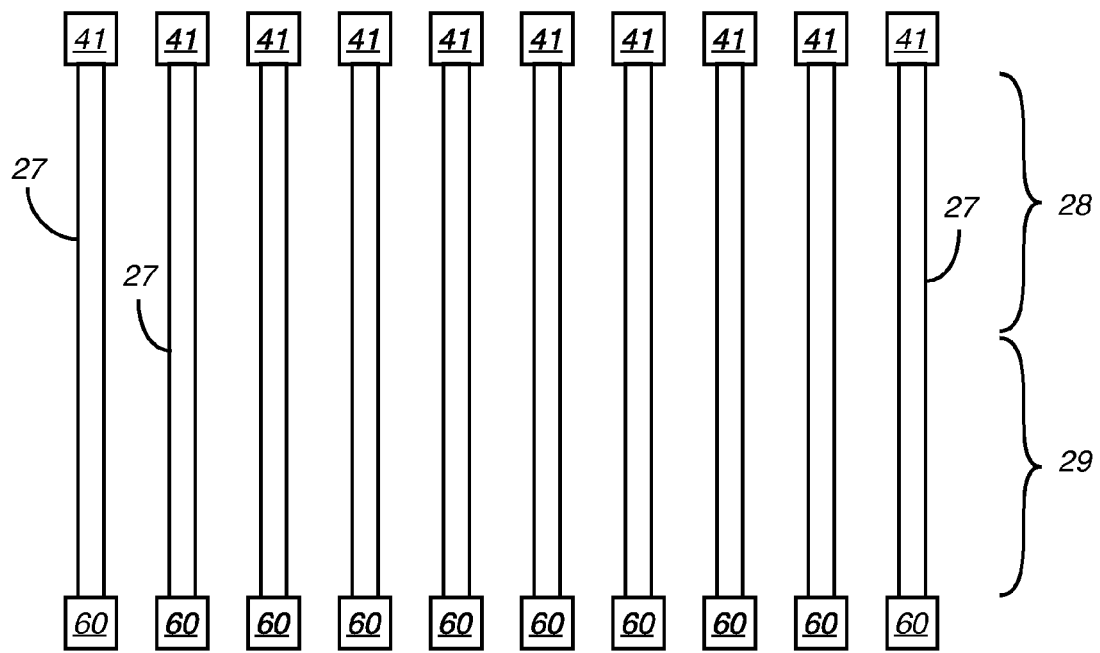

FIGS. 11 and 12 illustrate embodiments similar to those of FIGS. 8 and 9, respectively, except that the lower portion 29 of each plasma power coupler 26, 27 is not connected to the electrical power source 30. Instead, the lower portion 29 of each plasma power coupler is connected to an electrical reactance 60 that functions as a termination impedance for the plasma power coupler. Alternatively, the reactance 60 can be omitted, leaving the lower portion 29 of each plasma power coupler unconnected to any electrical component other than the upper portion 28 of the plasma power coupler.

Regardless of whether the embodiments of FIGS. 11 and 12 include the aforesaid reactance 60, the electrical power supplied by the electrical power source 30 to the upper portion 28 of each plasma power coupler 26, 27 will propagate to the lower portion 29 of that plasma power coupler, but with progressive attenuation due to the coupling of such power to the plasma within the plasma chamber. Because of this attenuation, the level of power in the upper portion 28 will be greater than the level in the lower portion 29. Therefore, the embodiments of FIGS. 11 and 12 fulfill the requirement of the invention that the electrical power source 30 supplies a greater level of power to the upper portion than the lower portion of the plasma source 20.

6. Conclusion

Advantageously, each of these aspects or embodiments of the invention tends to increase the density of the plasma adjacent the upper portion 28 of the plasma source 20. When used in combination with tilted workpieces whose upper ends are more widely spaced than their lower ends, the invention advantageously offsets the decrease in the density of the plasma adjacent the upper portion of the workpieces that otherwise would result from the tilt of the workpieces. Consequently, the invention enables a more uniform spatial distribution of the density of the plasma adjacent the exposed surfaces 13, 14 of the respective workpieces.

Any of the plasma power couplers 21-27 described above can be replaced by a plurality of plasma power couplers electrically connected in series, in parallel, or in a combination of series and parallel.

In each of the embodiments described above that includes a plurality of electrical power generators 41-45, in order to avoid creating a fixed standing wave pattern, the generators preferably are not locked together in frequency.

The invention claimed is:

1. Apparatus for coupling electrical power to a plasma, comprising:
a plasma source comprising at least three plasma power couplers that are spaced apart vertically;
wherein the plasma source is characterized by an upper portion and a lower portion that are the respective portions of the plasma source that are respectively above and below a horizontal geometric plane that bisects the vertical height of the plasma source; and
wherein the number of said plasma power couplers that are in the upper portion of the plasma source is greater than the number of said plasma power couplers that are in the lower portion of the plasma source.

2. The apparatus of claim 1, further comprising:
a plasma chamber;
wherein the plasma source is positioned so as to couple power to a plasma within the plasma chamber; and
wherein the plasma source is the only source of power to the plasma.

3. Apparatus for coupling electrical power to a plasma, comprising:
first and second workpiece supports for supporting first and second workpieces at first and second workpiece positions, respectively; and
a plasma source, located between the first and second workpiece positions, comprising at least three plasma power couplers that are spaced apart vertically;
wherein the plasma source is characterized by an upper portion and a lower portion that are the respective portions of the plasma source that are respectively above and below a horizontal geometric plane that bisects the combined area of the two workpiece positions; and
wherein the number of said plasma power couplers that are in the upper portion of the plasma source is greater than the number of said plasma power couplers that are in the lower portion of the plasma source.

4. The apparatus of claim 3, wherein:
the first and second workpiece positions are tilted at a first and second acute angle, respectively, relative to a vertical plane between the two workpiece positions such that the first and second workpiece positions are more widely spaced at their respective upper ends than at their respective lower ends.

5. The apparatus of claim 3, further comprising:
a plasma chamber;
wherein the first and second workpiece positions are within the plasma chamber.

6. The apparatus of claim 3, further comprising:
a plasma chamber;
wherein the plasma source is positioned so as to couple power to a plasma within the plasma chamber; and
wherein the plasma source is the only source of power to the plasma.

7. Apparatus for coupling electrical power to a plasma, comprising:
a plasma chamber;
a plasma source having an upper and a lower portion; and
an electrical power source connected to supply electrical power to the plasma source;
wherein the electrical power source supplies a greater level of power to the upper portion of the plasma source than to the lower portion of the plasma source;
wherein the plasma source is positioned so as to couple power to a plasma within the plasma chamber; and
wherein the plasma source is the only source of power to the plasma.

8. The apparatus of claim 7, wherein:
the upper portion and the lower portion of the plasma source are respectively above and below a horizontal geometric plane that bisects the vertical height of the plasma source.

9. Apparatus for coupling electrical power to a plasma, comprising:
- a plasma source having an upper portion and a lower portion;
- an electrical power source connected to supply electrical power to the plasma source; and
- first and second workpiece supports for supporting first and second workpieces at first and second workpiece positions, respectively;
- wherein the first and second workpiece positions are tilted at a first and second acute angle, respectively, relative to a vertical plane between the two workpiece positions such that the first and second workpiece positions are more widely spaced at their respective upper ends than at their respective lower ends;
- wherein the plasma source is between the first and second workpiece positions; and
- wherein the electrical power source supplies a greater level of power to the upper portion of the plasma source than to the lower portion of the plasma source.

10. The apparatus of claim 9, wherein:
- the upper portion and the lower portion of the plasma source are respectively above and below a horizontal geometric plane that bisects the vertical height of the plasma source.

11. The apparatus of claim 9, further comprising:
- a plasma chamber;
- wherein the plasma source is within the plasma chamber.

12. Apparatus for coupling electrical power to a plasma, comprising:
- a plasma source having an upper portion and a lower portion;
- an electrical power source connected to supply electrical power to the plasma source; and
- first and second workpiece supports for supporting first and second workpieces at first and second workpiece positions, respectively;
- wherein the plasma source is between the first and second workpiece positions;
- wherein the upper portion and the lower portion of the plasma source are respectively above and below a horizontal geometric plane that bisects the combined area of the first and second workpiece positions; and
- wherein the electrical power source supplies a greater level of power to the upper portion of the plasma source than to the lower portion of the plasma source.

13. The apparatus of claim 12, wherein:
- the first and second workpiece positions are tilted at a first and second acute angle, respectively, relative to a vertical plane between the two workpiece positions such that the first and second workpiece positions are more widely spaced at their respective upper ends than at their respective lower ends.

14. The apparatus of claim 12, further comprising:
- a plasma chamber;
- wherein the first and second workpiece positions are within the plasma chamber.

15. A method of coupling electrical power to a plasma, comprising the step of:
- providing a plasma source comprising at least three plasma power couplers that are spaced apart vertically;
- wherein the plasma source is characterized by an upper portion and a lower portion that are the respective portions of the plasma source that are respectively above and below a horizontal geometric plane that bisects the vertical height of the plasma source; and
- wherein the number of said plasma power couplers that are in the upper portion of the plasma source is greater than the number of said plasma power couplers that are in the lower portion of the plasma source.

16. A method of coupling electrical power to a plasma, comprising the steps of:
- supporting first and second workpieces at first and second workpiece positions, respectively; and
- providing a plasma source between the first and second workpiece positions;
- wherein:
- the plasma source comprises at least three plasma power couplers that are spaced apart vertically;
- the plasma source is characterized by an upper portion and a lower portion that are the respective portions of the plasma source that are respectively above and below a horizontal geometric plane that bisects the combined area of the two workpiece positions; and
- the number of said plasma power couplers that are in the upper portion of the plasma source is greater than the number of said plasma power couplers that are in the lower portion of the plasma source.

17. A method of coupling electrical power to a plasma, comprising the steps of:
- providing a plasma source having an upper portion and a lower portion;
- supplying electrical power to the plasma source such that a greater level of power is supplied to the upper portion of the plasma source than to the lower portion of the plasma source; and
- supporting first and second workpieces at first and second workpiece positions, respectively;
- wherein the plasma source is between the first and second workpiece positions; and
- wherein the upper portion and the lower portion of the plasma source are respectively above and below a horizontal geometric plane that bisects the combined area of the first and second workpiece positions.

18. A method of coupling electrical power to a plasma, comprising the steps of:
- providing a plasma source having an upper portion and a lower portion;
- supplying electrical power to the plasma source such that a greater level of power is supplied to the upper portion of the plasma source than to the lower portion of the plasma source;
- providing a plasma chamber; and
- coupling power from the plasma source to a plasma within the plasma chamber;
- wherein the plasma source is the only source of power to the plasma.

19. The method of claim 18, wherein:
- the upper portion and the lower portion of the plasma source are respectively above and below a horizontal geometric plane that bisects the vertical height of the plasma source.

* * * * *